(12) United States Patent
Fujiki et al.

(10) Patent No.: US 10,756,104 B2
(45) Date of Patent: Aug. 25, 2020

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventors: Jun Fujiki, Mie (JP); Shinya Arai, Yokkaichi (JP); Kotaro Fujii, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/129,082

(22) Filed: Sep. 12, 2018

(65) Prior Publication Data

US 2019/0198524 A1 Jun. 27, 2019

(30) Foreign Application Priority Data

Dec. 25, 2017 (JP) ................. 2017-247987

(51) Int. Cl.
| | |
|---|---|
| *H01L 27/11582* | (2017.01) |
| *H01L 27/1157* | (2017.01) |
| *H01L 27/11573* | (2017.01) |
| *H01L 21/768* | (2006.01) |
| *H01L 27/07* | (2006.01) |

(52) U.S. Cl.
CPC .. *H01L 27/11582* (2013.01); *H01L 21/76897* (2013.01); *H01L 27/0727* (2013.01); *H01L 27/1157* (2013.01); *H01L 27/11573* (2013.01)

(58) Field of Classification Search
CPC .......... H01L 27/0727; H01L 27/11563–11582
See application file for complete search history.

(56) References Cited

U.S. PATENT DOCUMENTS

| | | |
|---|---|---|
| 8,389,990 B2 | 3/2013 | Mikawa et al. |
| 2011/0073866 A1 | 3/2011 | Kim et al. |
| 2014/0085979 A1 | 3/2014 | Kono |
| 2018/0090509 A1 | 3/2018 | Zhang et al. |
| 2018/0323207 A1 | 11/2018 | Shim et al. |
| 2019/0081065 A1 | 3/2019 | Lee |
| 2019/0288003 A1 | 9/2019 | Shim et al. |

FOREIGN PATENT DOCUMENTS

JP 2010-165794 7/2010

*Primary Examiner* — Robert G Bachner
*Assistant Examiner* — Molly K Reida
(74) *Attorney, Agent, or Firm* — Oblon, McClelland, Maier & Neustadt, L.L.P.

(57) ABSTRACT

A semiconductor memory device includes a semiconductor substrate including a diode formed in an upper layer portion of the semiconductor substrate, a first insulating film provided above the semiconductor substrate, a first conductive film provided above the first insulating film and coupled to the diode, a stacked body provided above the first conductive film, an insulator and an electrode film being stacked alternately in the stacked body, a semiconductor member piercing the stacked body and being connected to the first conductive film, and a charge storage member provided between the electrode film and the semiconductor member.

20 Claims, 15 Drawing Sheets

SEMICONDUCTOR MEMORY DEVICE AND METHOD FOR MANUFACTURING SAME

CROSS-REFERENCE TO RELATED APPLICATION

This application is based upon and claims the benefit of priority from Japanese Patent Application No. 2017-247987, filed on Dec. 25, 2017; the entire contents of which are incorporated herein by reference.

FIELD

Embodiments described herein relate generally to a semiconductor memory device and a method for manufacturing same.

BACKGROUND

In recent years, a stacked semiconductor memory device has been proposed in which memory cells are integrated three-dimensionally. For such a stacked semiconductor memory device, investigations are being performed to realize even more downsizing by providing a thick insulating film between the semiconductor substrate and the memory cells and by forming a control circuit inside the insulating film and the upper layer portion of the semiconductor substrate. In such a case, a conductive film is provided on the insulating film and used as a source line.

DETAILED DESCRIPTION

According to one embodiment, a semiconductor memory device includes a semiconductor substrate including a diode formed in an upper layer portion of the semiconductor substrate, a first insulating film provided above the semiconductor substrate, a first conductive film provided above the first insulating film and coupled to the diode, a stacked body provided above the first conductive film, an insulator and an electrode film being stacked alternately in the stacked body, a semiconductor member piercing the stacked body and being connected to the first conductive film, and a charge storage member provided between the electrode film and the semiconductor member.

First Embodiment

A first embodiment will now be described.

Figure 1:
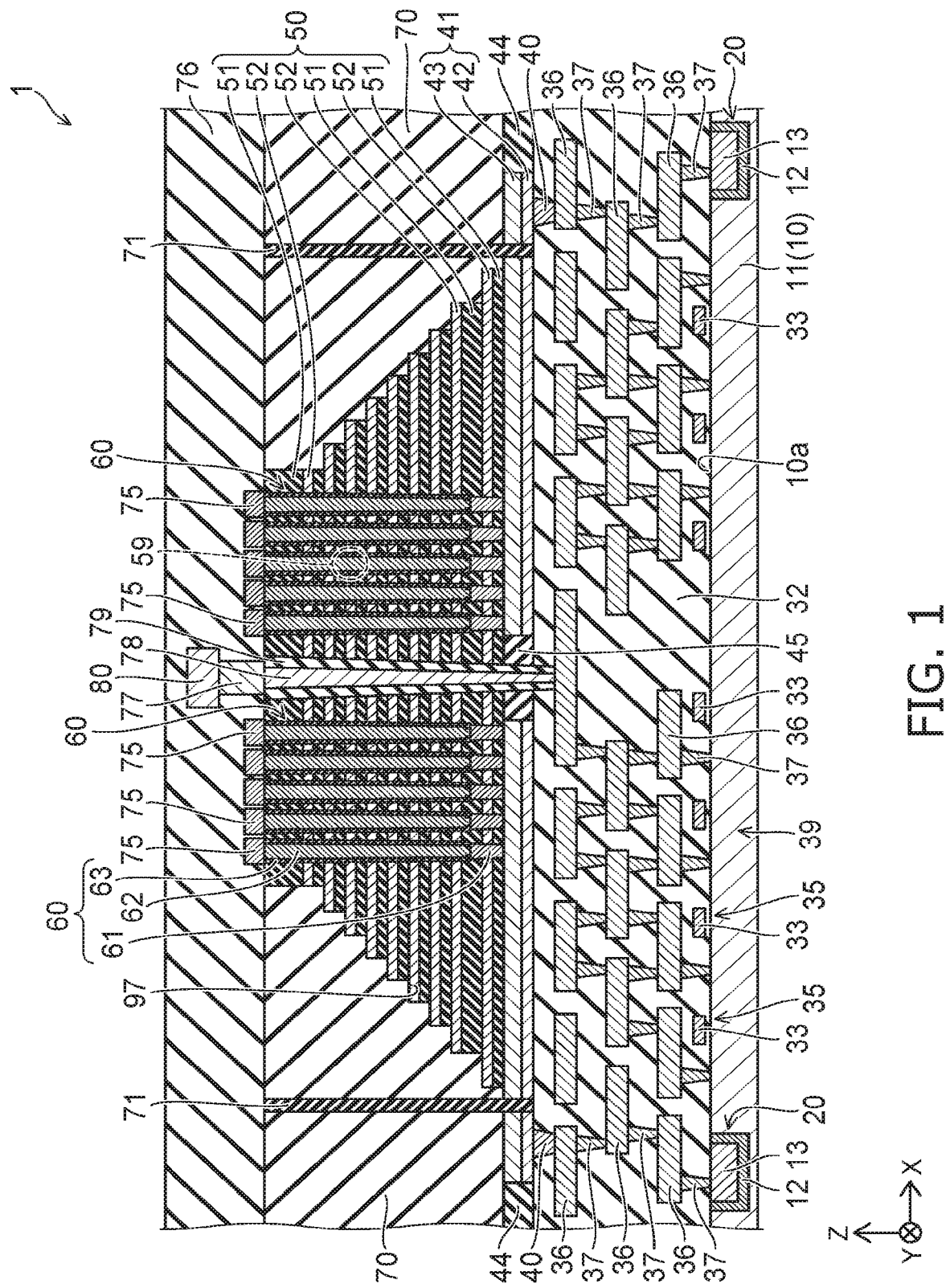
FIG. 1 is a cross-sectional view showing a semiconductor memory device according to a first embodiment.
Figure 2:
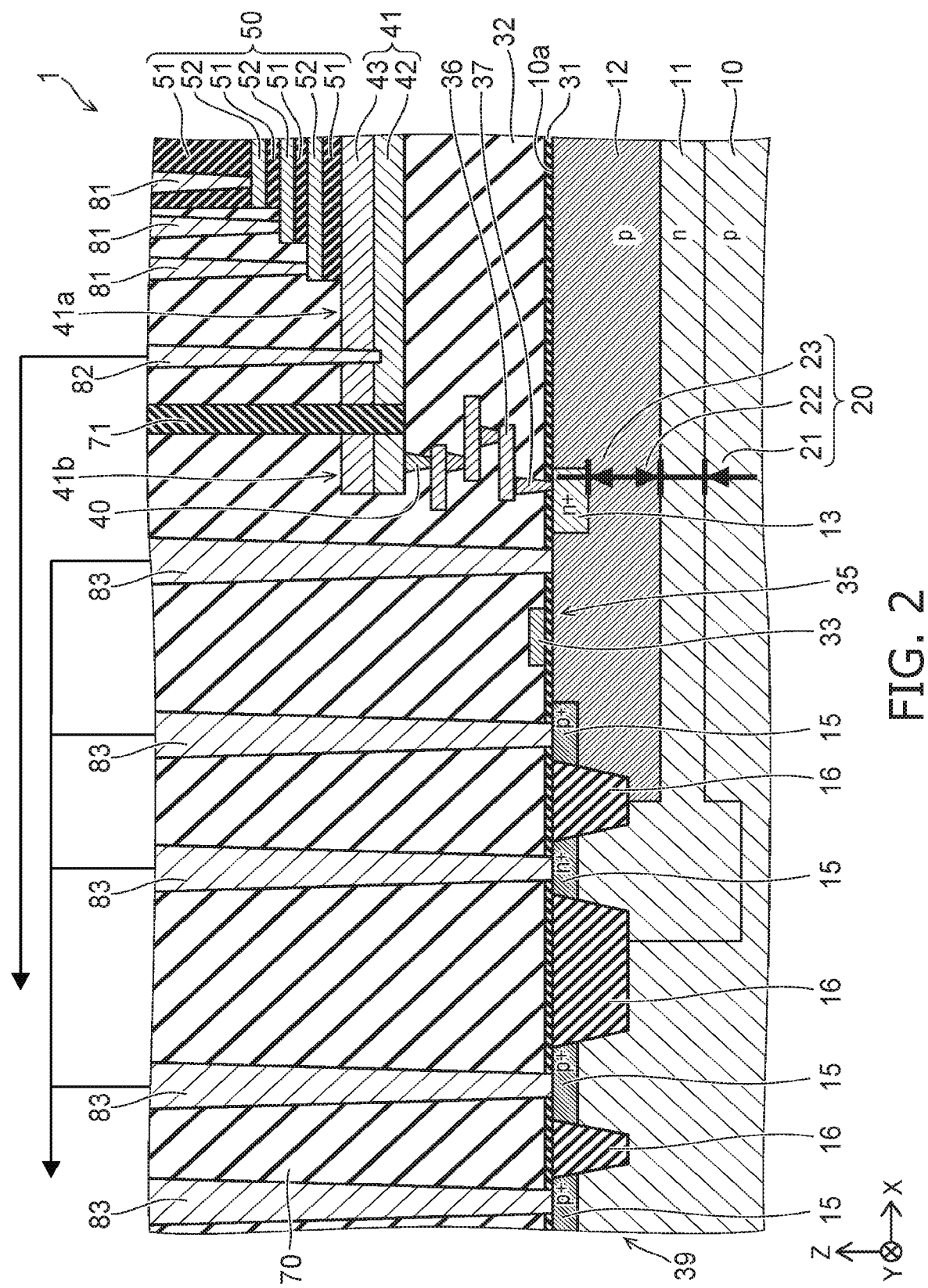
FIG. 2 is a cross-sectional view showing the semiconductor memory device according to the first embodiment.

FIG. 1 and FIG. 2 are cross-sectional views showing a semiconductor memory device according to the embodiment.

Figure 3:
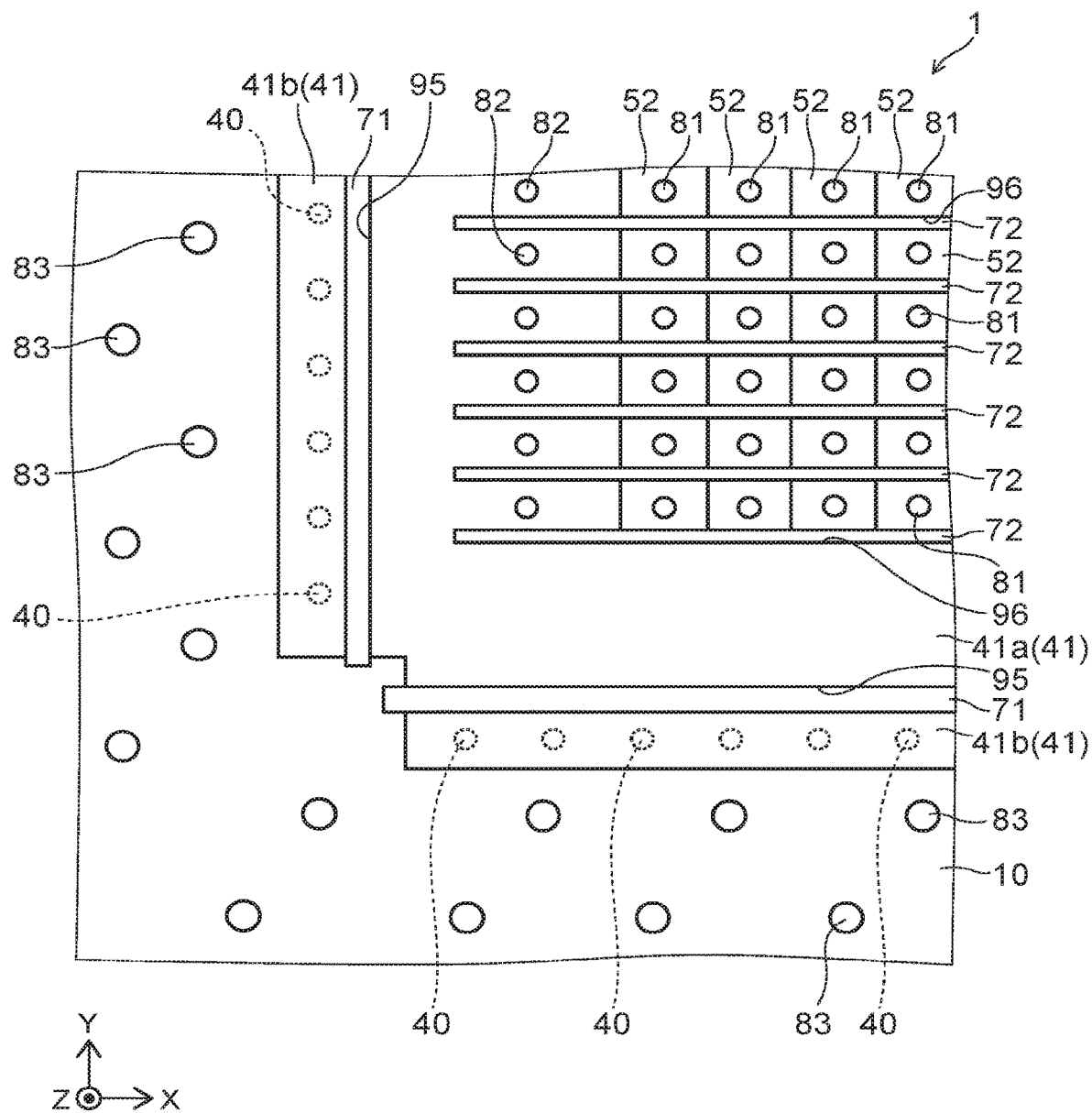
FIG. 3 is a top view showing the semiconductor memory device according to the first embodiment.

FIG. 3 is a top view showing the semiconductor memory device according to the embodiment.

Figure 4:
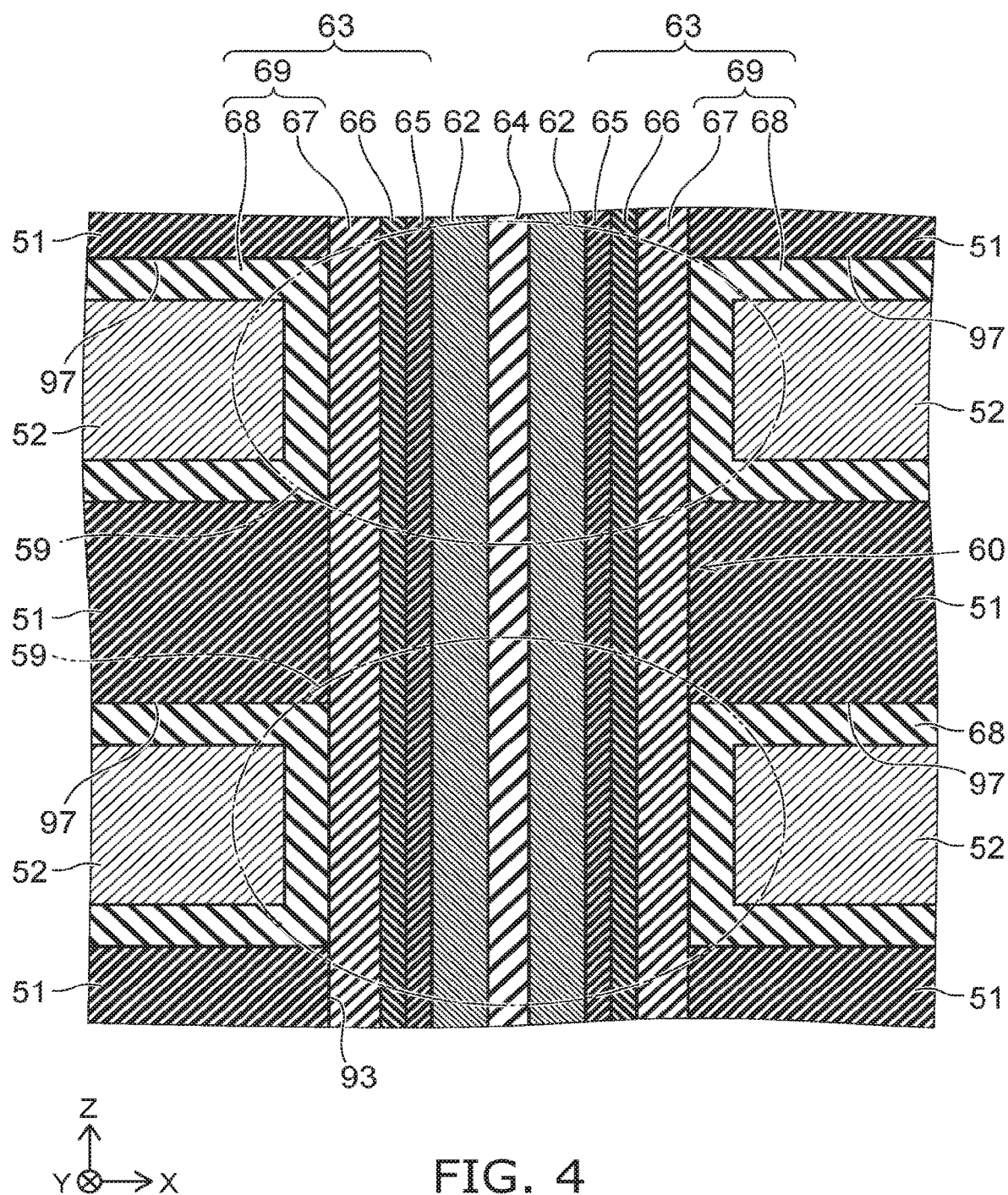
FIG. 4 is a cross-sectional view showing a memory cell transistor of the semiconductor memory device according to the first embodiment.
Figure 5:
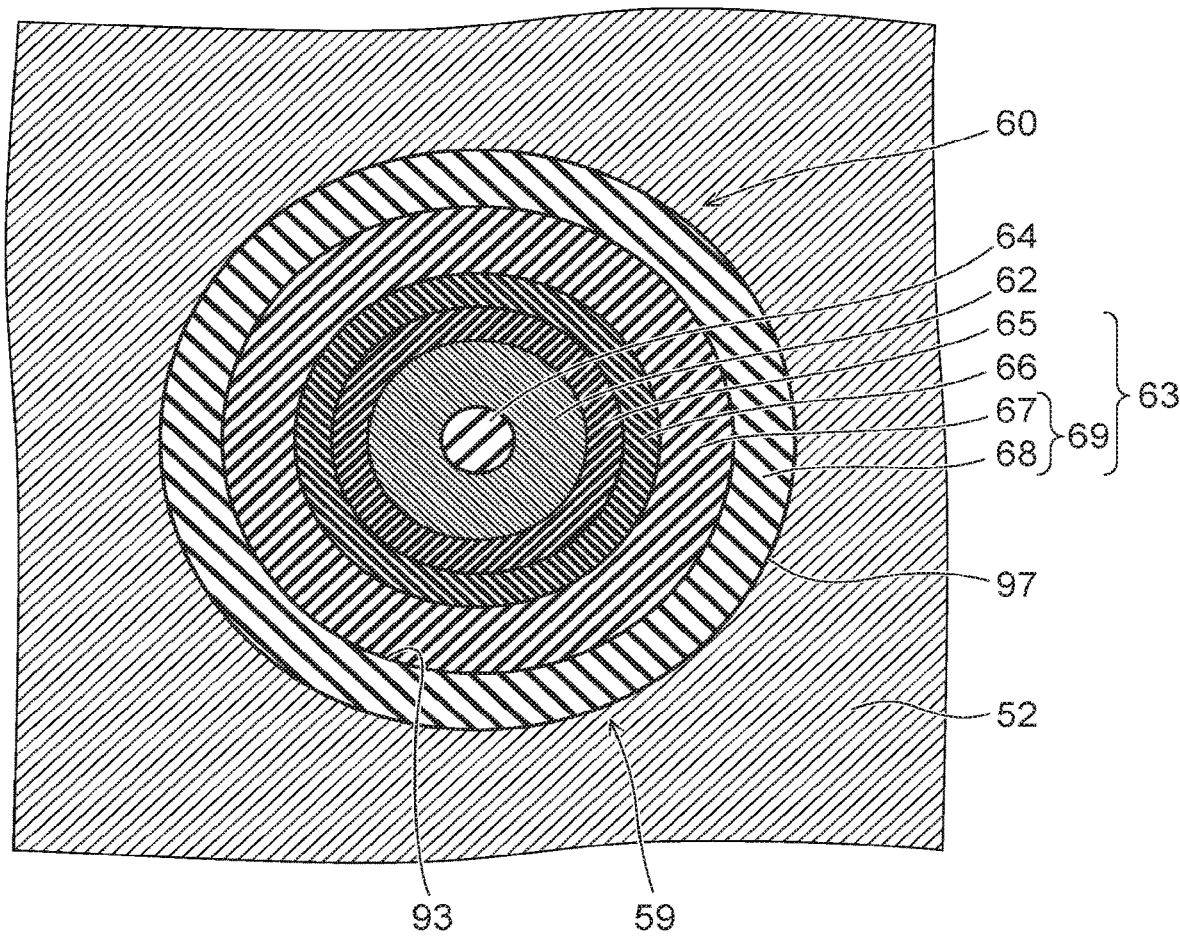
FIG. 5 is a cross-sectional view showing a memory cell transistor of the semiconductor memory device according to the first embodiment.

FIG. 4 and FIG. 5 are cross-sectional views showing the memory cell transistor of the semiconductor memory device according to the embodiment.

The drawings are schematic and are drawn with appropriate exaggerations or omissions. For example, the components are drawn to be larger and fewer than the actual components. Also, the numbers, dimensional ratios, etc., of the components do not always match between the drawings.

The semiconductor memory device according to the embodiment is stacked NAND flash memory.

As shown in FIG. 1, a silicon substrate 10 is provided in the semiconductor memory device 1 according to the embodiment. For example, the silicon substrate 10 is formed of single-crystal silicon (Si).

As shown in FIG. 2, for example, the conductivity type of the main body portion of the silicon substrate 10 is a p-type. An n-type well 11 is formed in a portion of the upper layer portion of the silicon substrate 10. A p-type well 12 is formed in a portion of the upper layer portion of the n-type well 11. An $n^+$-type diffusion layer 13 is formed in a portion of the upper layer portion of the p-type well 12. The donor concentration of the $n^+$-type diffusion layer 13 is higher than the donor concentration of the n-type well 11.

A diode 21 is formed at the interface between the silicon substrate 10 and the n-type well 11; a diode 22 is formed at the interface between the p-type well 12 and the n-type well 11; and a diode 23 is formed at the interface between the p-type well 12 and the $n^+$-type diffusion layer 13. A bidirectional diode 20 is formed by connecting the diode 21, the diode 22, and the diode 23 in series. One or multiple bidirectional diodes 20 are formed in a portion of the upper layer portion of the silicon substrate 10.

A diffusion layer 15 and STI (Shallow Trench Isolation (an element-separating insulating film)) 16 are formed in the upper layer portion of the silicon substrate 10. Also, for example, the source/drain layers of MOSFETs (Metal-Oxide-Semiconductor Field-Effect Transistors) (not illustrated), etc., are formed in the upper layer portion of the silicon substrate 10.

As shown in FIG. 1 and FIG. 2, a gate insulating layer 31 is formed on the silicon substrate 10; and an insulating film 32 is formed on the gate insulating layer 31. For example, the gate insulating layer 31 and the insulating film 32 are formed of silicon oxide (SiO). For example, the gate insulating layer 31 is formed by thermal oxidation of the silicon substrate 10; and, for example, the insulating film 32 is formed by CVD (Chemical Vapor Deposition) using TEOS (Tetraethyl orthosilicate ($Si(OC_2H_5)_4$)) as a source material.

In the specification hereinbelow, an XYZ orthogonal coordinate system is employed for convenience of description. Two mutually-orthogonal directions parallel to an upper surface 10a of the silicon substrate 10 are taken as an "X-direction" and a "Y-direction;" and a direction perpendicular to the upper surface 10a of the silicon substrate 10 is taken as a "Z-direction." Although a direction that is in the Z-direction from the silicon substrate 10 toward the insulating film 32 also is called "up" and the reverse direction also is called "down," these expressions are for convenience and are independent of the direction of gravity.

A gate electrode 33 is provided inside the insulating film 32 on the gate insulating layer 31. A MOSFET 35 is formed of source/drain layers (not illustrated), the gate insulating layer 31, and the gate electrode 33. Interconnects 36 and plugs 37 are formed inside the insulating film 32. A portion of the plugs 37 connects the interconnects 36 to each other; and another portion of the plugs 37 connects the interconnect 36 to the diffusion layer 15 of the silicon substrate 10. A control circuit 39 includes the MOSFET 35, a portion of the interconnects 36, and a portion of the plugs 37. Other components may be included in the control circuit 39. A plug 40 is provided on the interconnect 36 of the uppermost level inside the insulating film 32.

A source electrode film 41 is provided on the insulating film 32. The configuration of the source electrode film 41 is a substantially flat plate configuration spreading along the XY plane and is patterned into a prescribed configuration as described below. In the source electrode film 41, for example, a metal layer 42 that is made of tungsten (W) is provided; and, for example, a silicon layer 43 that is made of polycrystalline silicon (Si) is provided on the metal layer 42. An insulating film 44 is provided at the periphery of the source electrode film 41. An insulating film 45 that pierces the source electrode film 41 in the Z-direction is provided in a region surrounded with the source electrode film 41.

A portion of the lower surface of the source electrode film 41 contacts the plug 40. Thereby, the portion of the source electrode film 41 is connected to the upper end of the plug 40. The lower end of the plug 40 is connected to a portion of the interconnect 36 of the uppermost level. The interconnect 36 is connected to the interconnects 36 of lower levels by the plugs 37; and a portion of the interconnect 36 of the lowermost level is connected to the upper surface of the $n^+$-type diffusion layer 13 via the plug 37. Thereby, a portion of the source electrode film 41 is connected to one end of the bidirectional diode 20 via the plug 40, the multiple interconnects 36, and the multiple plugs 37. The current path from the source electrode film 41 to the bidirectional diode 20 is insulated from the control circuit 39.

A stacked body 50 is provided on the source electrode film 41. In the stacked body 50, insulating films 51 and electrode films 52 are stacked alternately along the Z-direction. The insulating films 51 are made of, for example, silicon oxide; and the electrode films 52 are made of, for example, tungsten. The configuration of the end portion of the stacked body 50 is a staircase configuration in which terraces are formed every electrode film 52. Air gaps may be formed as the insulators instead of the insulating films 51.

A columnar portion 60 is provided inside the stacked body 50. The configuration of the columnar portion 60 is a circular column having a central axis extending in the Z-direction. A silicon member 61 is provided at the lower portion of the columnar portion 60; and a silicon pillar 62 is provided on the silicon member 61. A memory film 63 is provided at the periphery of the silicon pillar 62. The silicon pillar 62 is connected to the silicon member 61; and the silicon member 61 is connected to the source electrode film 41.

As shown in FIG. 4 and FIG. 5, a core member 64 that is made of silicon oxide is provided inside the silicon pillar 62. A tunneling insulating film 65, a charge storage film 66, and a silicon oxide layer 67 are provided in this order from the inner side, i.e., the silicon pillar 62 side, toward the outer side in the memory film 63. On the other hand, an aluminum oxide layer 68 is provided on the upper surface of the electrode film 52, on the lower surface of the electrode film 52, and on the side surface of the electrode film 52 opposing the silicon pillar 62. A blocking insulating film 69 includes the silicon oxide layer 67 and the aluminum oxide layer 68.

Although the tunneling insulating film 65 normally is insulative, the tunneling insulating film 65 is a film in which a tunneling current flows when a prescribed voltage within the range of the drive voltage of the semiconductor memory device 1 is applied and is, for example, a single-layer silicon oxide film or an ONO film in which a silicon oxide layer, a silicon nitride layer, and a silicon oxide layer are stacked in this order. The charge storage film 66 is a film that can store charge, is made from, for example, a material having trap sites of electrons, and is made of, for example, silicon nitride. The blocking insulating film 69 is a film in which a current substantially does not flow even when a voltage within the range of the drive voltage of the semiconductor memory device 1 is applied.

The memory film 63 is formed of the tunneling insulating film 65, the charge storage film 66, and the blocking insulating film 69. The memory film 63 is disposed between the silicon pillar 62 and the electrode film 52. The columnar portion 60 includes the silicon member 61, the silicon pillar 62, the memory film 63, and the core member 64. The silicon pillar 62 is insulated from the electrode films 52 by the memory film 63. The silicon member 61 also is insulated from the electrode films 52 by an insulating film (not illustrated).

As shown in FIG. 1 to FIG. 3, an insulating film 70 that is made of, for example, silicon oxide is provided at the periphery of the stacked body 50 on the source electrode film 41 and on the insulating film 44. An insulating plate 71 is provided inside the insulating film 70 to substantially surround the stacked body 50. The insulating plate 71 is separated from the stacked body 50. The insulating plate 71 pierces the source electrode film 41 and reaches the insulating film 32. Also, multiple insulating plates 72 that extend in the X-direction are provided inside the stacked body 50. The insulating plates 72 pierce the insulating films 51 and the electrode films 52 of the stacked body 50 and reach the source electrode film 41. For example, a block that is used as the minimum unit of the data erase is formed of each of the stacked bodies 50 divided in the Y-direction by the insulating plates 72. For example, the insulating plates 71 and 72 are formed of silicon oxide. The insulating plate 71 and the insulating plates 72 may be linked to each other. Also, the configuration of the insulating plate 71 may be a frame-like configuration surrounding the stacked body 50 when viewed from the Z-direction. However, even in such a case, the insulating plate 71 is separated from the stacked body 50.

The source electrode film 41 is divided by the insulating plate 71 into a central portion 41a disposed on the inner side of the insulating plate 71 and a peripheral portion 41b disposed on the outer side of the insulating plate 71. The central portion 41a and the peripheral portion 41b are insulated from each other by the insulating plate 71. In other words, the lower portion of the insulating plate 71 is disposed between the central portion 41a and the peripheral portion 41b. The central portion 41a is connected to the silicon pillars 62 via the silicon members 61. The peripheral portion 41b is connected to the bidirectional diode 20 via the plug 40, the interconnects 36, and the plugs 37.

Bit lines 75 that extend in the Y-direction are provided on the stacked body 50 and on the insulating film 70. The bit lines 75 are connected to the upper ends of the silicon pillars 62. An insulating film 76 is provided on the stacked body 50 and on the insulating film 70 to cover the bit lines 75. A plug 77 is provided inside the insulating film 76. A through-via 78 that extends in the Z-direction to pierce the stacked body 50 and the insulating film 45 surrounded with the source electrode film 41 is provided between the plug 77 and the interconnect 36 of the control circuit 39. An insulating film 79 that is made of, for example, silicon oxide is provided at the periphery of the through-via 78. The through-via 78 is insulated from the electrode films 52 and the source electrode film 41 by the insulating film 79. An upper layer interconnect 80 is provided on the plug 77 and is connected to the plug 77.

As shown in FIG. 2 and FIG. 3, contacts 81 to 83 are provided inside the insulating film 70. The lower ends of the contacts 81 are connected to the electrode films 52; and the upper ends of the contacts 81 are connected to a portion of the upper layer interconnects (not illustrated). The lower ends of the contacts 82 are connected to the source electrode film 41; and the upper ends of the contacts 82 are connected to another portion of the upper layer interconnects (not illustrated). The lower ends of the contacts 83 are connected to the diffusion layers 15 of the silicon substrate 10, etc.; and the upper ends of the contacts 83 are connected to yet another portion of the upper layer interconnects (not illustrated).

In the semiconductor memory device 1 according to the embodiment, a memory cell 59 is formed at each crossing portion between the electrode films 52 and the silicon pillars 62. The channel of the memory cell 59 is the silicon pillar 62; the gate insulating film is the tunneling insulating film 65 and the blocking insulating film 69; the gate is the electrode film 52; and the charge storage member is the charge storage film 66. The control circuit 39 injects charge from the silicon pillar 62 into the charge storage film 66 and discharges the charge from the charge storage film 66 into the silicon pillar 62 by controlling the potentials of the source electrode film 41, the bit lines 75, and the electrode films 52. Thereby, the threshold voltages of the memory cells 59 are changed; and data is stored.

A method for manufacturing the semiconductor memory device according to the embodiment will now be described.

FIG. 6 to FIG. 10 are cross-sectional views showing the method for manufacturing the semiconductor memory device according to the embodiment.

Figure 6:
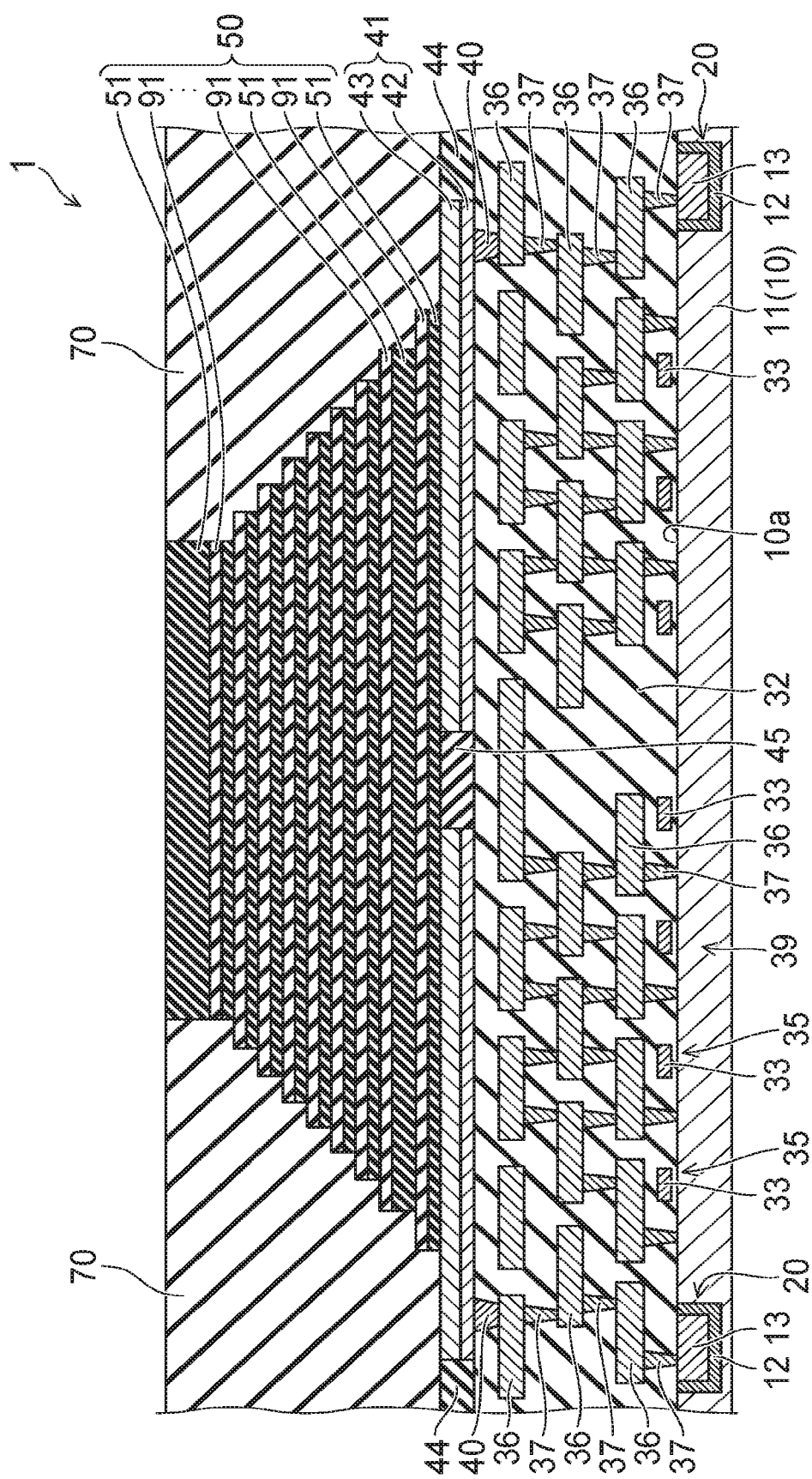
FIG. 6 is a cross-sectional view showing a method for manufacturing the semiconductor memory device according to the first embodiment.

First, as shown in FIG. 6 and FIG. 2, the n-type well 11, the p-type well 12, the $n^+$-type diffusion layer 13, the diffusion layer 15, the STI 16, etc., are formed in the upper layer portion of the silicon substrate 10. Thereby, the bidirectional diode 20 is formed in a portion of the upper layer portion of the silicon substrate 10.

Continuing, the gate insulating layer 31 is formed in the upper surface 10a of the silicon substrate 10 by performing thermal oxidation treatment. Then, for example, the gate electrode 33, the plugs 37, the interconnects 36, and the plug 40 are formed while forming the insulating film 32 by repeating CVD using TEOS as a source material. Thereby, the control circuit 39 is formed inside the insulating film 32 and the upper layer portion of the silicon substrate 10. At this time, the plug 40 is connected to the $n^+$-type diffusion layer 13 via a portion of the plugs 37 and a portion of the interconnects 36.

Continuing, the source electrode film 41 is formed by forming the metal layer 42 on the insulating film 32 and by depositing the silicon layer 43 on the metal layer 42. Then, the source electrode film 41 is patterned; the insulating film 44 is formed at the periphery of the source electrode film 41; and the insulating film 45 is formed in a region surrounded with the source electrode film 41.

Continuing, the stacked body 50 is formed on the source electrode film 41, the insulating film 44, and the insulating film 45 by alternately depositing the insulating films 51 made of silicon oxide and insulative sacrificial films 91 made of silicon nitride (SiN). The material of the sacrificial films 91 is not limited to silicon nitride as long as the material is insulative and has etching selectivity with respect to the insulating films 51. Then, the end portion of the stacked body 50 is patterned into a staircase configuration in which a terrace is formed every sacrificial film 91. Then, the insulating film 70 is formed at the periphery of the stacked body 50 by depositing silicon oxide.

Figure 7:
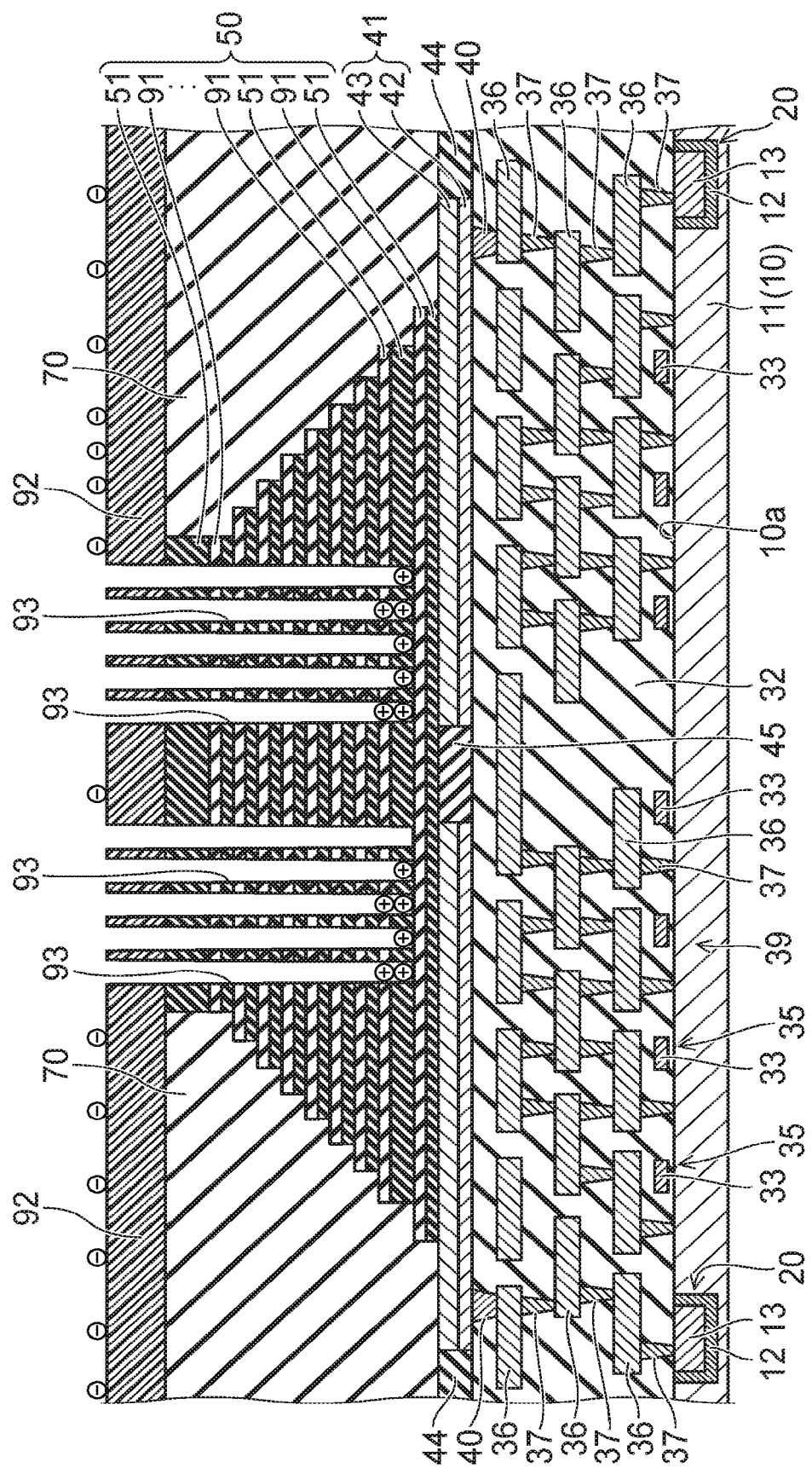
FIG. 7 is a cross-sectional view showing a method for manufacturing the semiconductor memory device according to the first embodiment.

Continuing as shown in FIG. 7, a mask pattern 92 is formed on the stacked body 50 and on the insulating film 70. Then, reactive ion etching (RIE) is performed using the mask pattern 92 as a mask. Specifically, positive ions of the etching species are generated by plasmatizing an etching gas; and the positive ions are accelerated by applying an electric field and caused to collide selectively with the stacked body 50 via the mask pattern 92. Thereby, memory holes 93 are formed in the stacked body 50. At this time, the stacked body 50 is formed from insulating materials, i.e., silicon oxide and silicon nitride; therefore, a positive charge that originates in the positive ions of the etching species accumulates inside the memory holes 93. On the other hand, at this stage, a negative charge accumulates on the outer surface of the intermediate structure body. In FIG. 7, the positive charge is illustrated by the symbols of "+" surrounded with a circle; and the negative charge is illustrated by the symbols of "−" surrounded with a circle.

Figure 8:
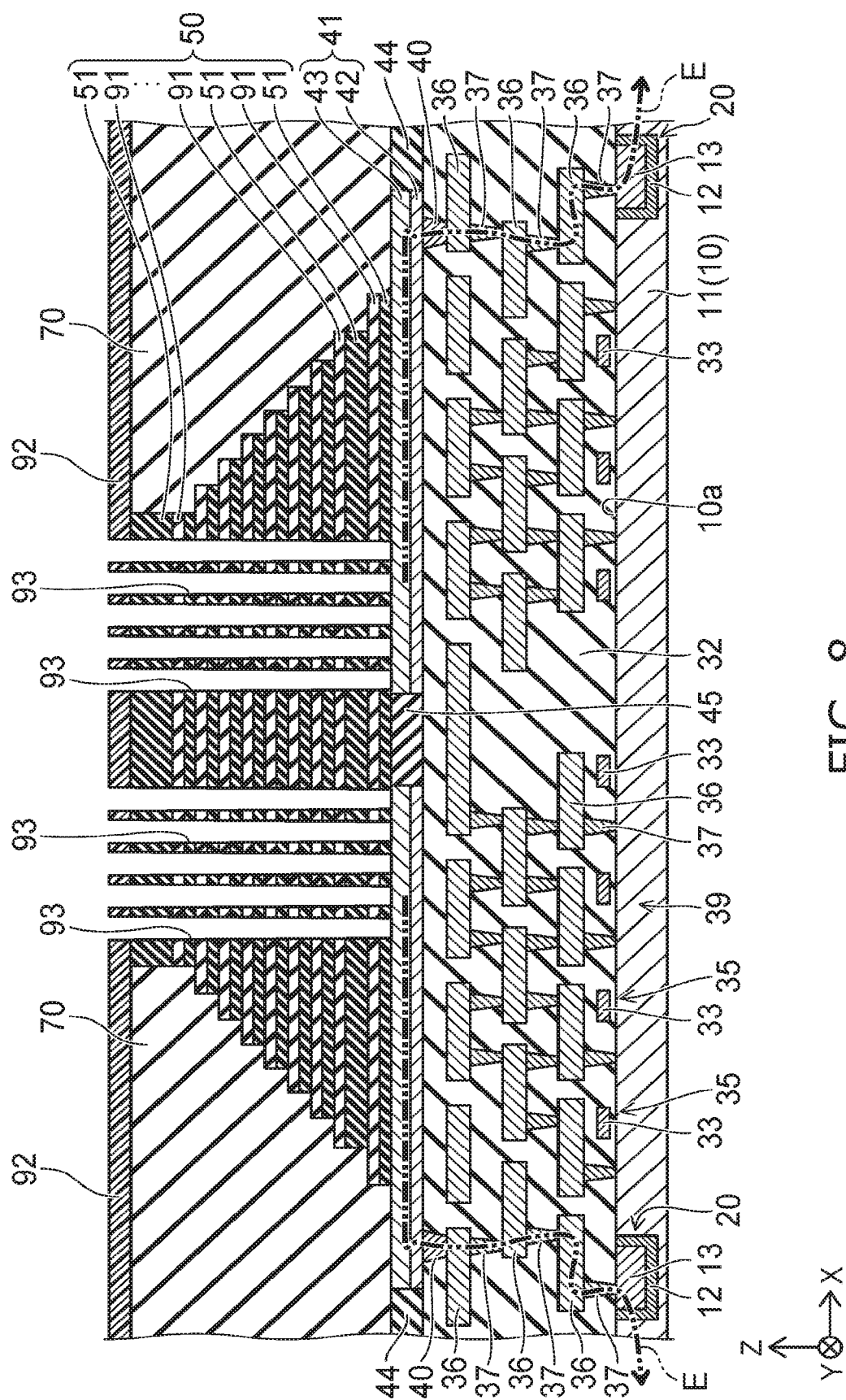
FIG. 8 is a cross-sectional view showing a method for manufacturing the semiconductor memory device according to the first embodiment.

Continuing as shown in FIG. 8, when the memory holes 93 reach the source electrode film 41, the positive charge that has accumulated inside the memory holes 93 moves into the source electrode film 41 and further flows into the $n^+$-type diffusion layer 13 via the plug 40, the interconnects 36, and the plugs 37 as shown by a path E in FIG. 8. Thereby, the diode 23 and the diode 21 of the bidirectional diode 20 breakdown; and the positive charge flows into the silicon substrate 10 via the bidirectional diode 20 and is discharged to the outside via the silicon substrate 10. As a result, arcing inside the insulating film 32 can be prevented.

Figure 9:
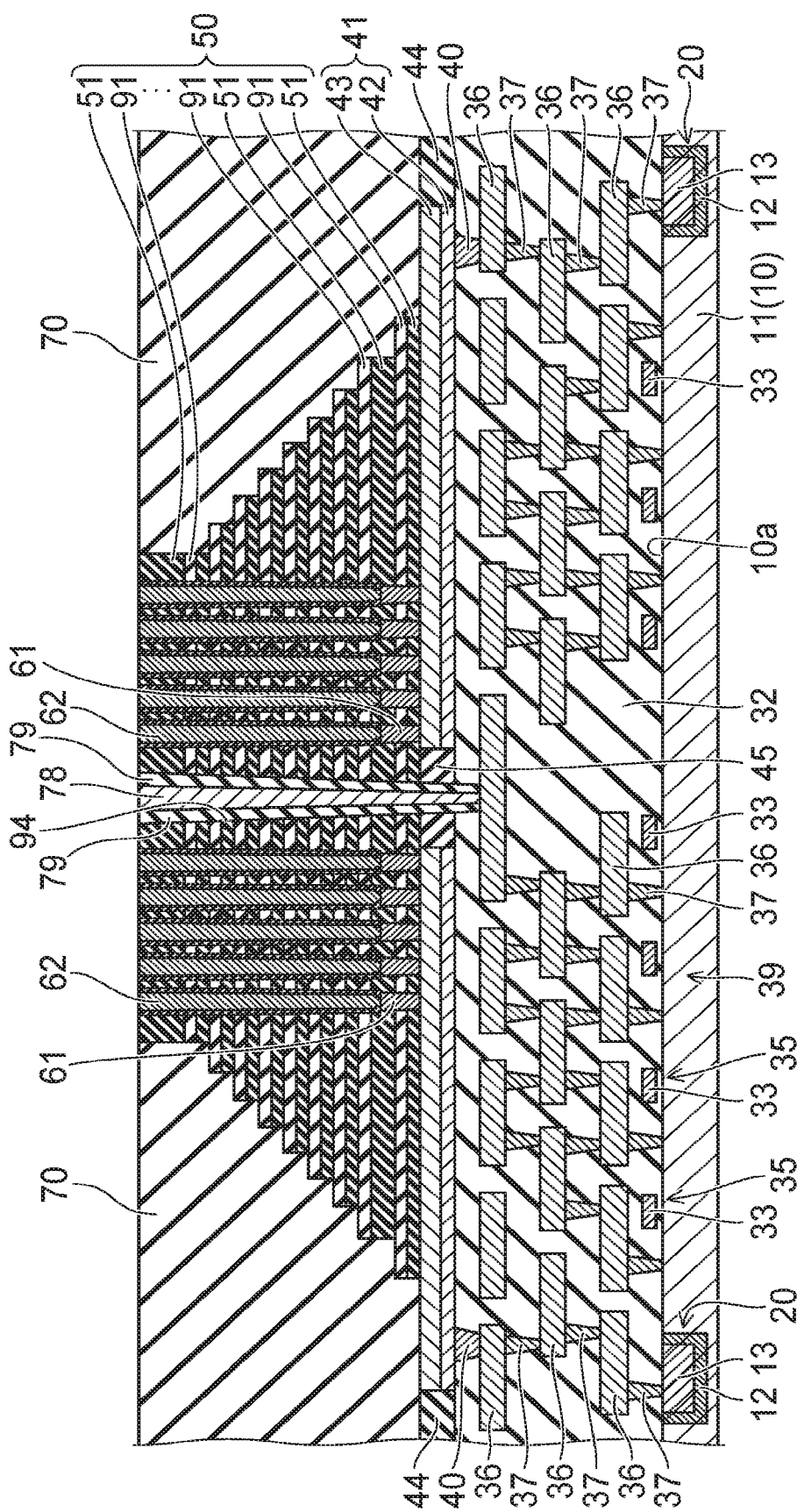
FIG. 9 is a cross-sectional view showing a method for manufacturing the semiconductor memory device according to the first embodiment.

Continuing as shown in FIG. 9, FIG. 4, and FIG. 5, the silicon members 61 are formed by epitaxial growth of the silicon inside the lower portions of the memory holes 93 by using the silicon layer 43 as a starting point. Then, the silicon oxide layer 67, the charge storage film 66, the tunneling insulating film 65, the silicon pillar 62, and the core member 64 are formed on the inner surfaces of the memory holes 93 on the silicon members 61. The silicon pillars 62 are connected to the source electrode film 41 via the silicon members 61. Then, a through-via hole 94 is formed to pierce the stacked body 50, the insulating film 45, and the upper portions of the insulating film 32 and reach a portion of the interconnect 36. Then, the insulating film 79 is formed on the inner surface of the through-via hole 94; and the through-via 78 is formed on the inner surface of the insulating film 79. The through-via 78 is connected to the interconnect 36.

Figure 10:
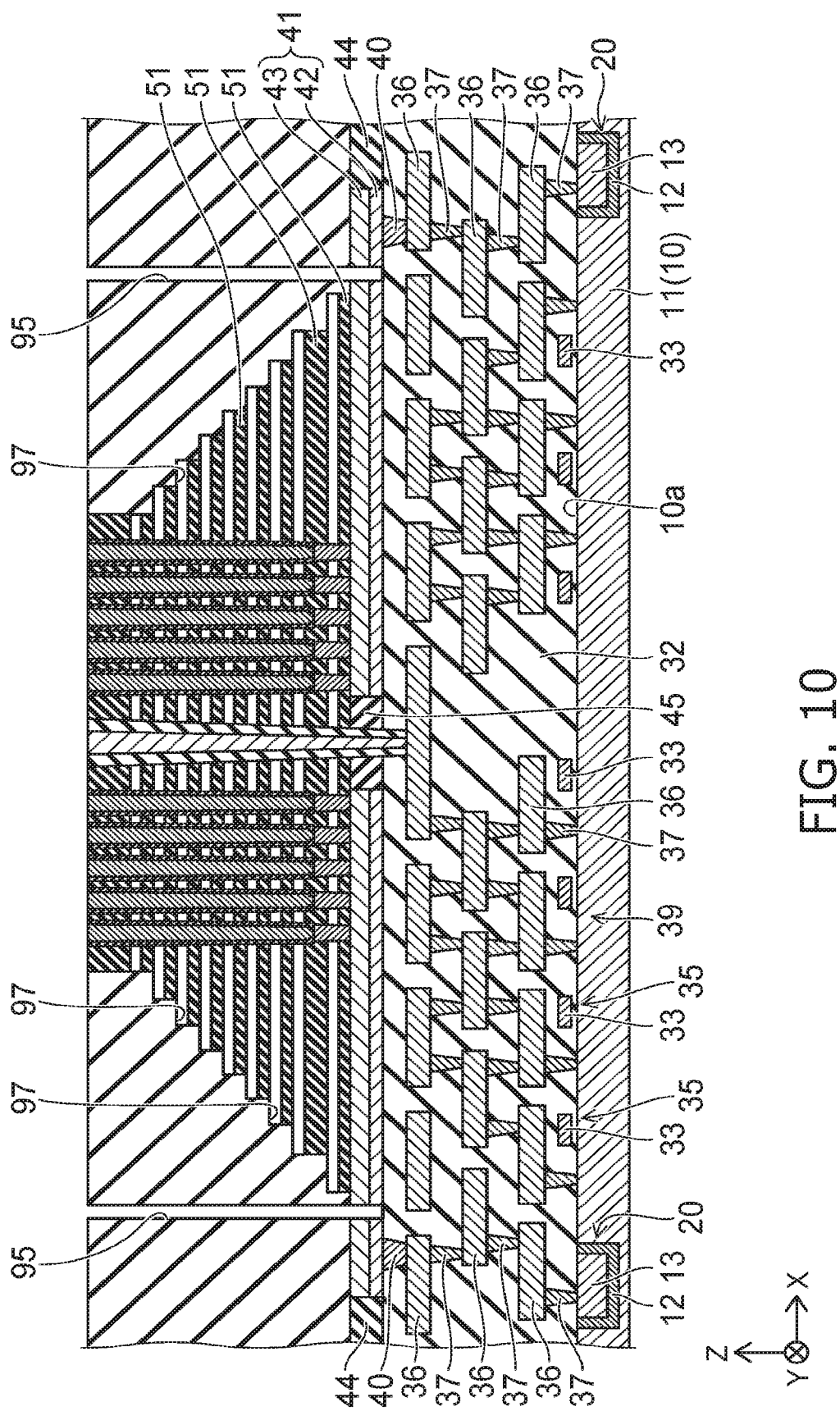
FIG. 10 is a cross-sectional view showing a method for manufacturing the semiconductor memory device according to the first embodiment.

Continuing as shown in FIG. 10 and FIG. 3, slits 95 are formed to pierce the insulating film 70 and the source electrode film 41; and slits 96 are formed to pierce the stacked body 50. The source electrode film 41 is divided into the central portion 41a and the peripheral portion 41b by the slits 95. This dividing causes the central portion 41a to be insulated from the silicon substrate 10 because the plug 40 is connected to only the peripheral portion 41b. Then, the sacrificial films 91 (referring to FIG. 9) are removed by performing wet etching via the slits 96. As a result, spaces 97 are formed where the sacrificial films 91 are removed.

Continuing as shown in FIG. 1, FIG. 4, and FIG. 5, the aluminum oxide layer 68 is formed on the inner surfaces of the spaces 97 via the slits 96. The aluminum oxide layer 68 contacts the silicon oxide layer 67; and the blocking insulating film 69 is formed of the aluminum oxide layer 68 and the silicon oxide layer 67. The memory film 63 is formed of the tunneling insulating film 65, the charge storage film 66, and the blocking insulating film 69. Then, a barrier metal layer (not illustrated) is formed on the inner surfaces of the spaces 97 via the slits 96; subsequently, the electrode film 52 is formed by filling a conductive material such as tungsten, etc., into the spaces 97. Then, the portions of the electrode film 52 and the aluminum oxide layer 68 formed inside the slits 95 and inside the slits 96 are removed by etching. Then, by filling silicon oxide into the slits 95 and into the slits 96, the insulating plates 71 are formed inside the slits 95; and the insulating plates 72 are formed inside the slits 96 (referring to FIG. 3).

Continuing as shown in FIG. 1, the bit lines 75 that extend in the Y-direction are formed on the stacked body 50 and on the insulating film 70 and connected to the silicon pillars 62. The insulating film 76 is formed on the stacked body 50 and on the insulating film 70; and the plug 77 and the upper layer interconnect 80 are formed inside the insulating film 76. The upper layer interconnect 80 is connected to the through-via 78 via the plug 77. Thus, the semiconductor memory device 1 according to the embodiment is manufactured.

Effects of the embodiment will now be described.

In the embodiment as shown in FIG. 6, the bidirectional diode 20 is formed in the upper layer portion of the silicon substrate 10. Also, the source electrode film 41 is connected to the bidirectional diode 20 via the plug 40, the interconnects 36, and the plugs 37 when forming the source electrode film 41 on the insulating film 32. Thereby, when the memory holes 93 reach the source electrode film 41 as shown in FIG. 8, the bidirectional diode 20 breaks down due to the positive charge accumulated inside the memory holes 93; and the positive charge flows in the silicon substrate 10 via the source electrode film 41, the plug 40, the interconnects 36, the plugs 37, the n$^+$-type diffusion layer 13, the p-type well 12, and the n-type well 11 and is emitted to the outside. Thereby, the arcing inside the insulating film 32 can be prevented; and the breakdown of the insulating film 32 can be avoided.

As shown in FIG. 10, the source electrode film 41 is divided into the central portion 41a and the peripheral portion 41b by forming the slits 95. As a result, in the semiconductor memory device 1 after completion shown in FIG. 1, the central portion 41a of the source electrode film 41 to which the silicon pillars 62 are connected can be insulated reliably from the silicon substrate 10; and the parasitic capacitance of the source electrode film 41 decreases. As a result, the operations of the semiconductor memory device 1 are more stable and faster.

Second Embodiment

A second embodiment will now be described.

Figure 11:
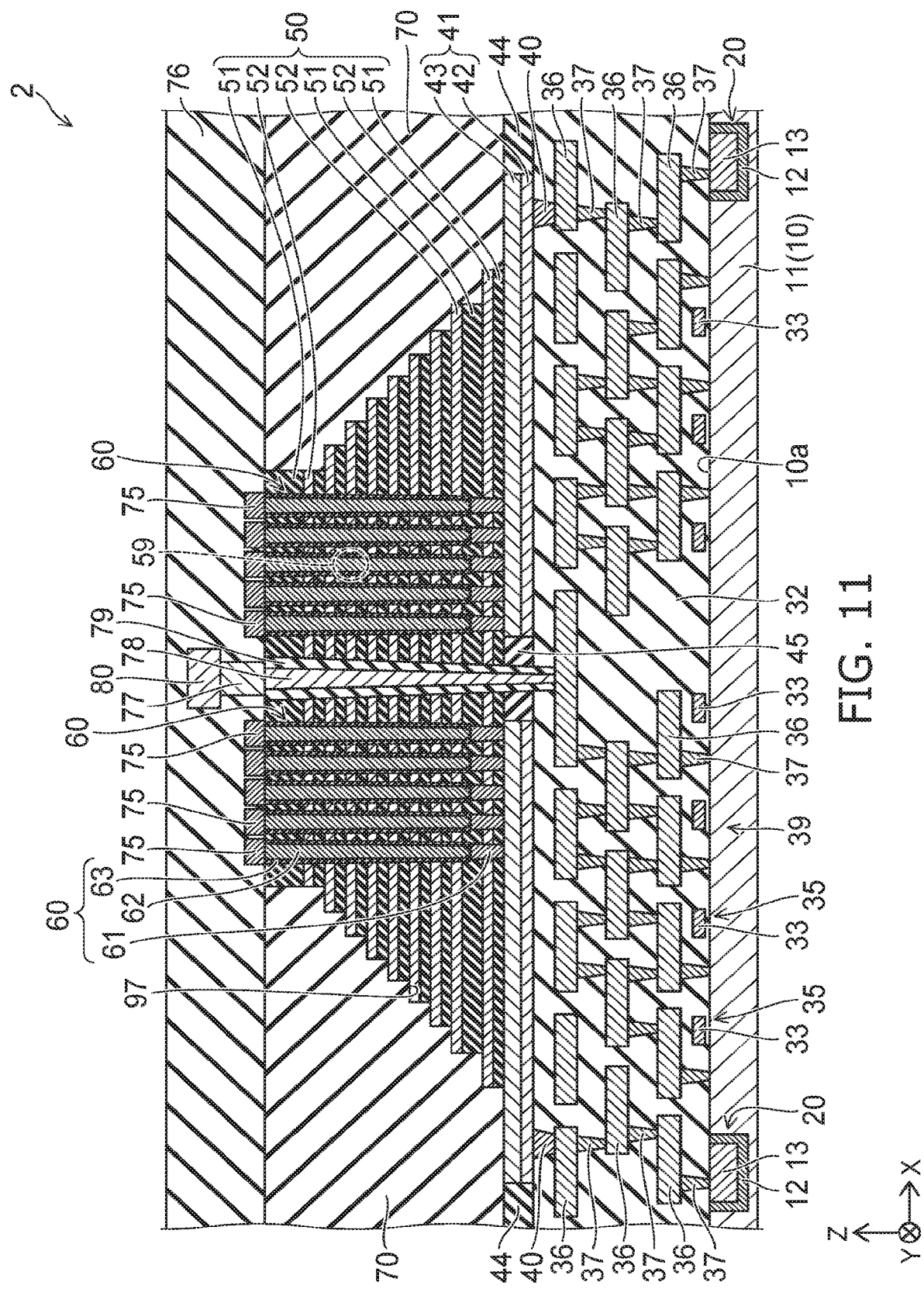
FIG. 11 is a cross-sectional view showing a semiconductor memory device according to a second embodiment.

FIG. 11 is a cross-sectional view showing a semiconductor memory device according to the embodiment.

As shown in FIG. 11, the semiconductor memory device 2 according to the embodiment differs from the semiconductor memory device 1 according to the first embodiment described above (referring to FIG. 1 to FIG. 5) in that the insulating plate 71 is not provided. The insulating plates 72 (referring to FIG. 3) are provided in the semiconductor memory device 2 as well.

The semiconductor memory device 2 can be manufactured by forming only the slits 96 (referring to FIG. 3) and by not forming the slits 95 in the process shown in FIG. 10.

According to the embodiment as well, similarly to the first embodiment described above, the positive charge that accumulates inside the memory holes 93 (referring to FIG. 7) flows in the bidirectional diode 20 via the source electrode film 41, the plug 40, the interconnects 36, and the plugs 37, causes the bidirectional diode 20 to breakdown, and is discharged to the outside via the silicon substrate 10. As a result, the breakdown of the insulating film 32 can be avoided.

In the semiconductor memory device 2 according to the embodiment, although the source electrode film 41 is not divided by the insulating plate 71 (referring to FIG. 1 and FIG. 3), the bidirectional diode 20 is interposed between the source electrode film 41 and the silicon substrate 10; therefore, the source electrode film 41 can be driven electrically independently from the silicon substrate 10 within the range of the prescribed potential difference.

Otherwise, the configuration, the manufacturing method, and the effects of the embodiment are similar to those of the first embodiment described above.

Third Embodiment

A third embodiment will now be described.

Figure 12:
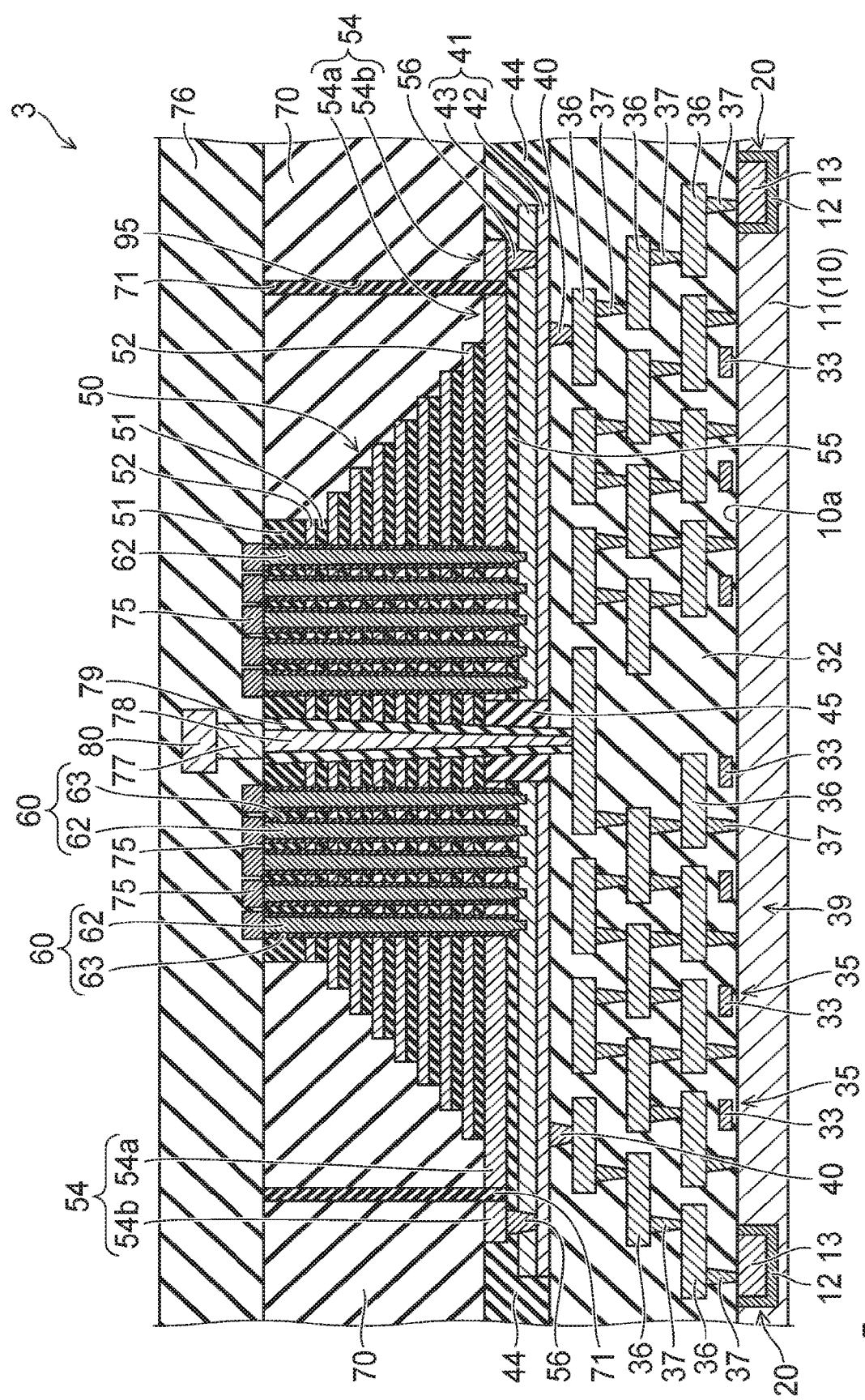
FIG. 12 is a cross-sectional view showing a semiconductor memory device according to a third embodiment.

FIG. 12 is a cross-sectional view showing a semiconductor memory device according to the embodiment.

Figure 13:
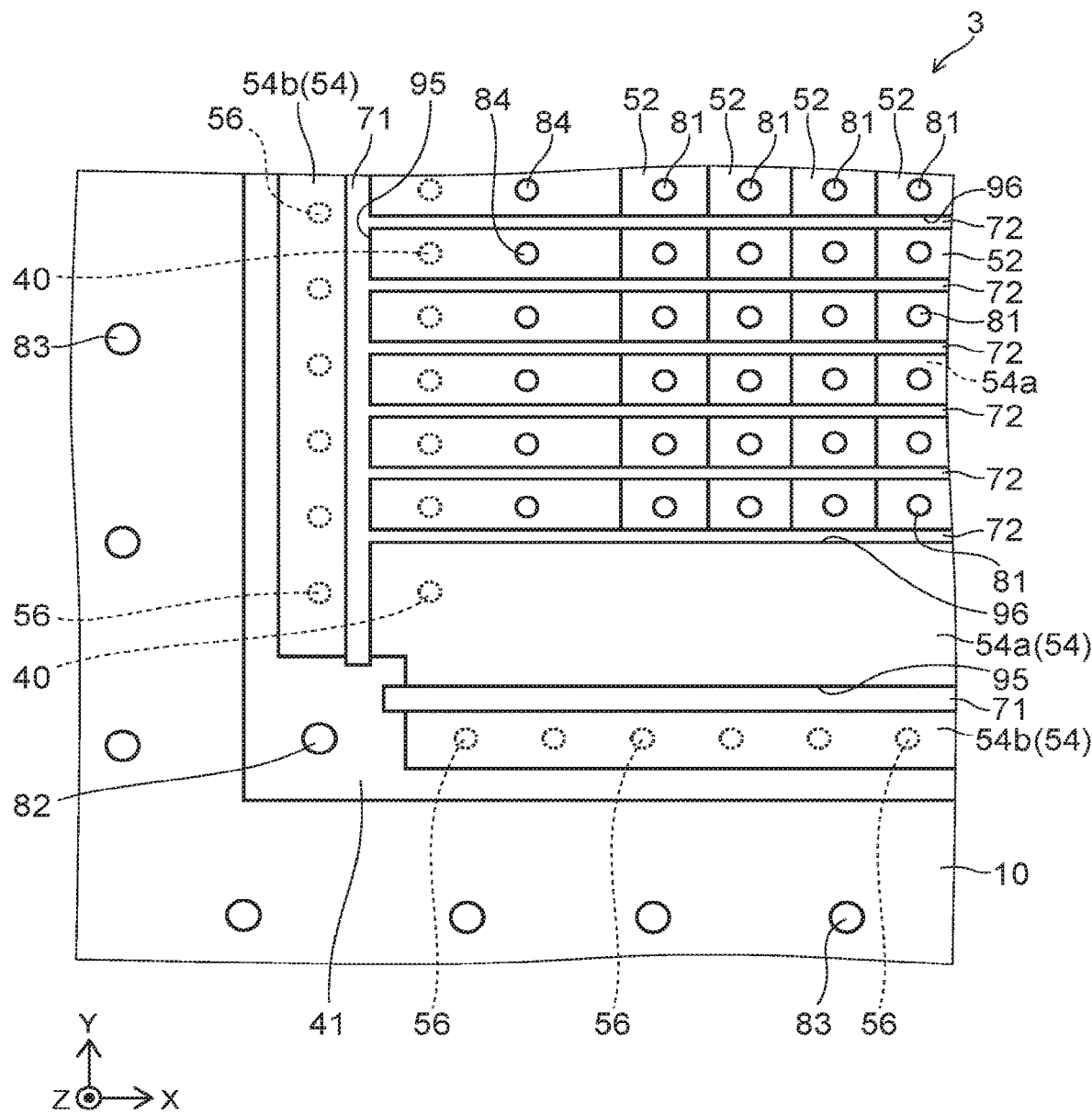
FIG. 13 is a top view showing the semiconductor memory device according to the third embodiment.

FIG. 13 is a top view showing the semiconductor memory device according to the embodiment.

In the semiconductor memory device 3 according to the embodiment as shown in FIG. 12 and FIG. 13, a silicon film 54 that is made of conductive polysilicon, an insulating film 55, and a plug 56 are provided in addition to the configuration of the semiconductor memory device 1 according to the first embodiment described above (referring to FIG. 1 to FIG. 5). The insulating plates 71 and the insulating plates 72 are linked to each other. The source electrode film 41 is not divided by the insulating plates 71 and 72; but the silicon film 54 is divided by the insulating plates 71 and 72. The silicon members 61 (referring to FIG. 1) are not provided; and the silicon pillars 62 are directly connected to the source electrode film 41.

Details will now be described.

The silicon film 54 is disposed between the source electrode film 41 and the stacked body 50; and the configuration of the silicon film 54 is a substantially flat plate configuration spreading along the XY plane. The insulating film 55 is disposed between the source electrode film 41 and the silicon film 54. The plug 56 pierces the insulating film 55 and the silicon layer 43 of the source electrode film 41; the lower end of the plug 56 contacts the metal layer 42 of the source electrode film 41; and the upper end of the plug 56 contacts the silicon film 54. Thereby, a portion of the silicon film 54 is connected to the source electrode film 41 via the plug 56. Similarly to the first embodiment, the source electrode film 41 is connected to the bidirectional diode 20 via the plug 40. Accordingly, a portion of the silicon film 54 is connected to the bidirectional diode 20 formed in a portion of the upper layer portion of the silicon substrate 10. The current path that reaches the bidirectional diode 20 from the silicon film 54 is insulated from the control circuit 39. The insulating film 44 is provided at the periphery of a stacked structure made of the source electrode film 41, the insulating film 55, and the silicon film 54. The insulating film 45 pierces the stacked structure in the Z-direction.

Although the insulating plates 71 and the insulating plates 72 pierce the silicon film 54 in the Z-direction, the insulating plates 71 and the insulating plates 72 do not pierce the source electrode film 41. Therefore, the silicon film 54 is divided into a central portion 54a and a peripheral portion 54b by the insulating plates 71; but the source electrode film 41 is not divided by the insulating plates 71. The plug 56 is connected to the peripheral portion 54b of the silicon film 54. The position of the plug 40 is not limited to the outside of the insulating plate 71. The central portion 54a is divided into a plurality of portions for each block by the insulating plate 72. As described above, the insulating plate 72 divides the stacked body 50 into a plurality of blocks in the Y direction. A contact 84 is provided for each block in the insulating film 70. The lower end of the contact 84 is connected to the central portion 54a of the silicon film 54. As a result, different potentials can be applied to the central portion 54a of the silicon film 54 for each block. On the other hand, the contact 82 connected to the source electrode film 41 is disposed at a position separated from the silicon film 54.

In the columnar portions 60, the silicon members 61 are not provided; and the lower ends of the silicon pillars 62 contact the source electrode film 41. The silicon pillars 62 pierce the central portion 54a of the silicon film 54 and are insulated from the silicon film 54 by the memory film 63 except for the aluminum oxide layer 68. The central portion 54a of the silicon film 54 functions as the gate electrode of the lowermost level for the silicon pillars 62, e.g., a select gate that switches the conduction/non-conduction of the silicon pillars 62 for each block.

A method for manufacturing the semiconductor memory device according to the embodiment will now be described.

Figure 14:
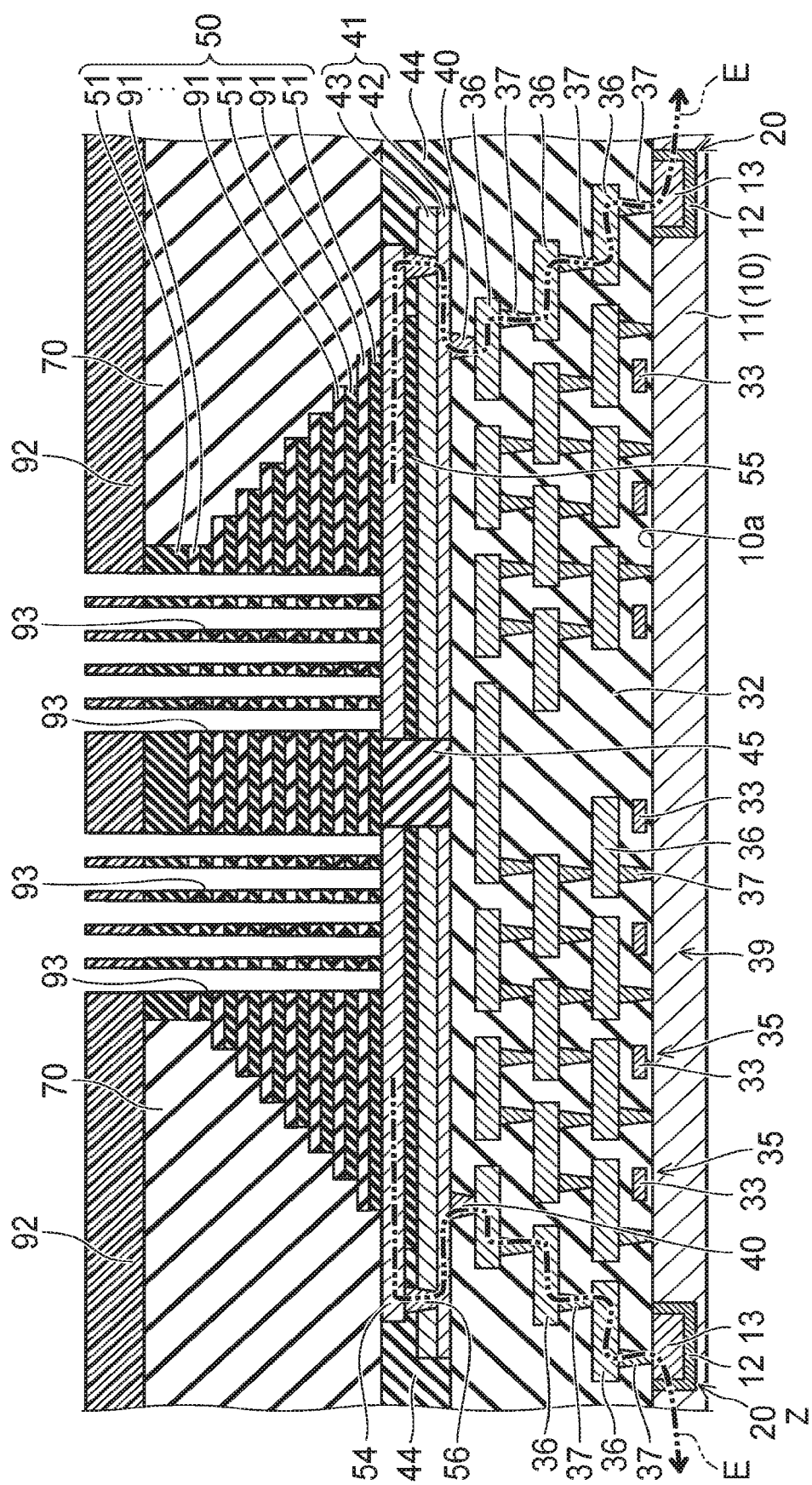
FIG. 14 is a cross-sectional view showing a method for manufacturing the semiconductor memory device according to the third embodiment.
Figure 15:
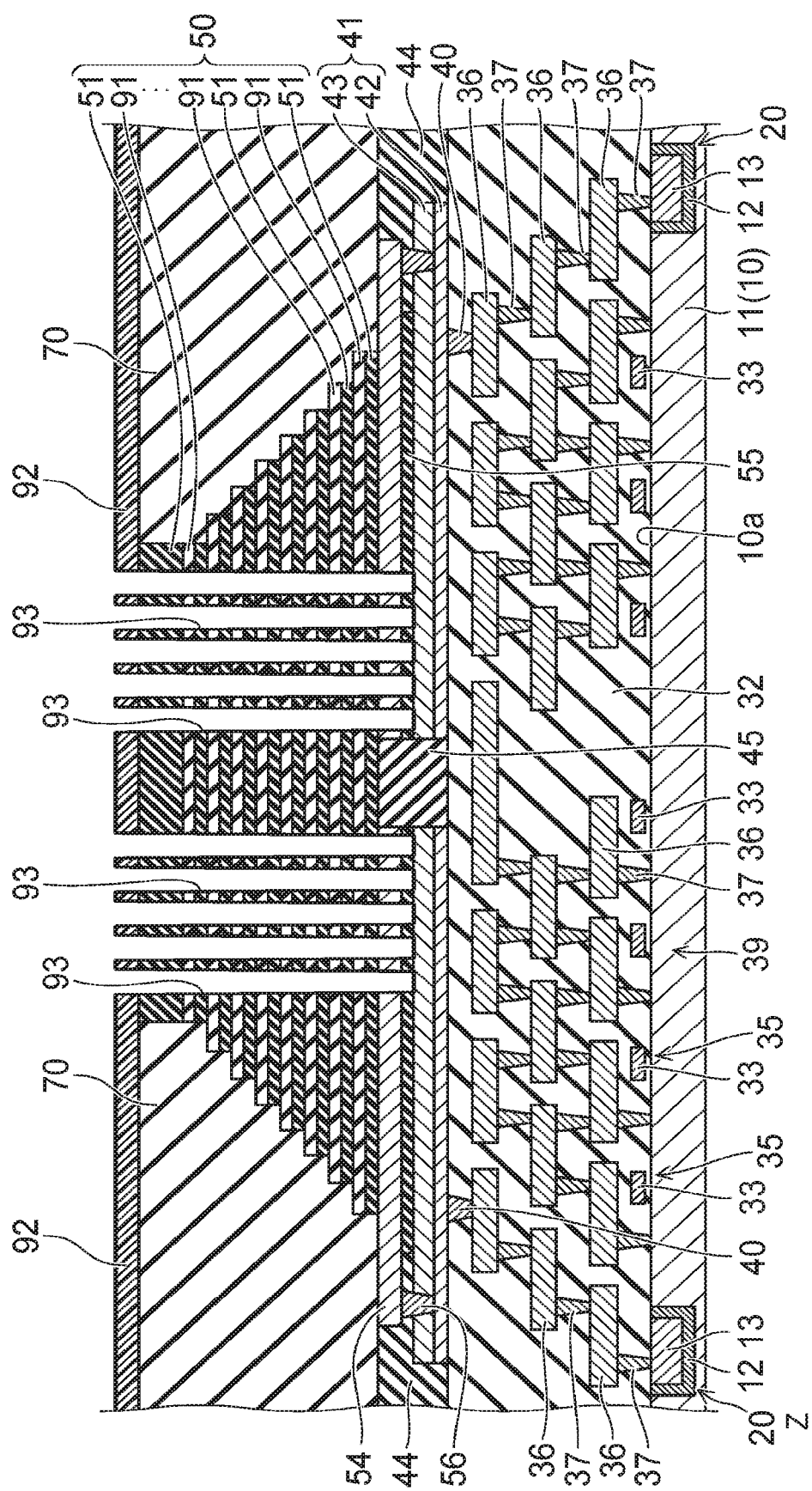
FIG. 15 is a cross-sectional view showing a method for manufacturing the semiconductor memory device according to the third embodiment.

FIG. 14 and FIG. 15 are cross-sectional views showing the method for manufacturing the semiconductor memory device according to the embodiment.

First, as shown in FIG. 14, the structure body from the silicon substrate 10 to the source electrode film 41 is made by a method similar to that of the first embodiment described above.

Continuing, the insulating film 55 is formed on the source electrode film 41; the plug 56 is formed inside the insulating film 55 and the silicon layer 43 of the source electrode film 41; and the silicon film 54 is formed on the plug 56. Then, the silicon film 54 and the insulating film 55 are patterned; the insulating film 44 is formed at the periphery of a stacked structure made of the source electrode film 41, the silicon film 54, and the insulating film 55; and the insulating film 45 is formed in a region surrounded with the stacked structure.

Continuing, the stacked body 50 is formed on the silicon film 54 by alternately depositing the insulating films 51 made of silicon oxide and the sacrificial films 91 made of silicon nitride. Then, the insulating film 70 is formed at the periphery of the stacked body 50. Then, the mask pattern 92 is formed on the stacked body 50 and on the insulating film 70. Then, the memory holes 93 are formed in the stacked body 50 by performing RIE by using the mask pattern 92 as a mask and by using the silicon film 54 as an etching stopper. The conditions of the RIE are set to conditions such that silicon oxide and silicon nitride are etched efficiently. At this time, similarly to the first embodiment, positive charge accumulates inside the memory holes 93.

Continuing, when the memory holes 93 reach the silicon film 54, the etching rate decreases. Thereby, the positions of the lower ends of the memory holes 93 are aligned. At this time, the positive charge that accumulates inside the memory holes 93 moves into the silicon film 54. Then, as shown by the path E, the positive charge moves into the source electrode film 41 via the plug 56, moves into the $n^+$-type diffusion layer 13 via the plug 40, the interconnects 36, and the plugs 37, causes breakdown of the bidirectional diode 20, and moves into the silicon substrate 10. Then, the positive charge is discharged to the outside via the silicon substrate 10. Thereby, the arcing at the insulating film 55 and the insulating film 32 can be prevented.

Continuing as shown in FIG. 15, the conditions of the RIE are modified to conditions such that silicon is etched efficiently; and the RIE is continued. Thereby, the memory holes 93 reach the insulating film 55. Then, the conditions of the RIE are modified to conditions such that silicon oxide is etched efficiently; and the RIE is continued. Thereby, the memory holes 93 reach the silicon layer 43 of the source electrode film 41. Here, the RIE is ended.

Continuing as shown in FIG. 12, FIG. 4, and FIG. 5, the silicon oxide layers 67, the charge storage films 66, the tunneling insulating films 65, the silicon pillars 62, and the core members 64 are formed on the inner surfaces of the memory holes 93. The silicon pillars 62 are connected to the silicon layer 43. Then, the insulating film 79 and the through-via 78 are formed.

Continuing as shown in FIG. 12, FIG. 13 and FIG. 3, the silicon film 54 is utilized once as an etching stopper; the insulating film 70, the stacked body 50, and the region below the insulating film 70 and the stacked body 50 are etched; and the slits 95 and 96 are formed to substantially uniform depths. For example, the slits 95 and 96 can be formed simultaneously by etching using one mask pattern as a mask. Although the slits 95 and 96 pierce the silicon film 54 at this time, the slits 95 and 96 do not pierce the source electrode film 41. Thereby, the silicon film 54 is divided into the central portion 54a and the peripheral portion 54b by the slit 95. The silicon pillars 62 are surrounded with the central portion 54a; and the plug 56 is connected to only the peripheral portion 54b; therefore, by dividing the silicon film 54, the central portion 54a of the silicon film 54 that functions as the gate electrode of the lowermost level can be insulated from the source electrode film 41. The subsequent manufacturing method is similar to that of the first embodiment described above.

Effects of the embodiment will now be described.

In the embodiment as well, similarly to the first embodiment described above, the bidirectional diode 20 is formed in the upper layer portion of the silicon substrate 10; and the source electrode film 41 is connected to the bidirectional diode 20 via the plug 40, the interconnects 36, and the plugs 37. The silicon film 54 is connected to the source electrode film 41 via the plug 56. Thereby, when the memory holes 93 reach the silicon film 54 as shown in FIG. 14, breakdown of the bidirectional diode 20 occurs; and the positive charge that accumulates inside the memory holes 93 flows in the silicon substrate 10 via the silicon film 54, the plug 56, the source electrode film 41, the plug 40, the interconnects 36, the plugs 37, the $n^+$-type diffusion layer 13, the p-type well 12, and the n-type well 11 and is emitted to the outside. Thereby, the arcing inside the insulating film 55 and inside the insulating film 32 can be prevented; and the breakdown of the insulating film 55 and the insulating film 32 can be avoided.

By forming the slits 95 as shown in FIG. 12 and FIG. 13, the silicon film 54 is divided into the central portion 54a and the peripheral portion 54b. As a result, in the semiconductor memory device 3 after completion, the central portion 54a that functions as the gate electrode of the lowermost level for the silicon pillars 62 can be insulated reliably from the source electrode film 41. Thereby, the central portion 54a and the source electrode film 41 can be driven electrically independently. Also, the parasitic capacitance of the central portion 54a decreases.

Because the bidirectional diode 20 is interposed between the source electrode film 41 and the silicon substrate 10, the source electrode film 41 can be driven electrically independently from the silicon substrate 10 within the range of the prescribed potential difference.

Otherwise, the configuration, the manufacturing method, and the effects of the embodiment are similar to those of the first embodiment described above.

According to the embodiments described above, a semiconductor memory device and a method for manufacturing the semiconductor memory device can be realized in which downsizing is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
    a semiconductor substrate including a diode formed in an upper layer portion of the semiconductor substrate;
    a first insulating film provided above the semiconductor substrate;
    a first conductive film provided above the first insulating film and coupled to the diode;
    a stacked body provided above the first conductive film, an insulator and an electrode film being stacked alternately in the stacked body;
    a semiconductor member piercing the stacked body and being connected to the first conductive film; and
    a charge storage member provided between the electrode film and the semiconductor member.

2. The device according to claim 1, wherein the semiconductor substrate includes:
    a first semiconductor layer of a first conductivity type;
    a second semiconductor layer formed in a portion of an upper layer portion of the first semiconductor layer, the second semiconductor layer being of a second conductivity type; and
    a third semiconductor layer formed in a portion of an upper layer portion of the second semiconductor layer, the third semiconductor layer being of the first conductivity type, and
    the first conductive film is coupled to the third semiconductor layer.

3. The device according to claim 2, wherein
    the semiconductor substrate is of the second conductivity type, and
    the first semiconductor layer is formed in a portion of the upper layer portion of the semiconductor substrate.

4. The device according to claim 1, further comprising a first plug coupled between the diode and the first conductive film,
    the first conductive film including
        a first portion connected to the semiconductor member, and
        a second portion connected to the first plug and insulated from the first portion.

5. The device according to claim 4, wherein
    the second portion is provided at a periphery of the first portion.

6. The device according to claim 4, further comprising:
    a second insulating film provided at a periphery of the stacked body; and
    an insulating plate provided inside the second insulating film and between the first portion and the second portion.

7. The device according to claim 4, further comprising:
    a first interconnect provided in the first insulating film and coupled between the first plug and the diode.

8. The device according to claim 7, further comprising:
    a second interconnect provided in the first insulating film and coupled to a transistor formed on the semiconductor substrate, the first interconnect being insulated from the second interconnect.

9. The device according to claim 8, further comprising:
    a through-via piercing the stacked body and the first conductive film, and coupled to the second interconnect.

10. The device according to claim 1, further comprising:
    a second conductive film provided between the first conductive film and the stacked body;
    an intermediate insulating film provided between the first conductive film and the second conductive film;
    a first plug coupled between the diode and the first conductive film; and
    a second plug coupled between the first conductive film and the second conductive film.

11. The device according to claim 10, wherein
    the second conductive film includes a first portion surrounding the semiconductor member, and a second portion connected to the second plug and insulated from the first portion.

12. The device according to claim 11, wherein
    the second portion is provided at a periphery of the first portion.

13. The device according to claim 11, further comprising:
a second insulating film provided at a periphery of the stacked body; and
an insulating plate provided inside the second insulating film and between the first portion and the second portion.

14. The device according to claim 10, further comprising:
a first interconnect provided in the first insulating film and coupled between the first plug and the diode.

15. The device according to claim 14, further comprising:
a second interconnect provided in the first insulating film and coupled to a transistor formed on the semiconductor substrate; and
a through-via piercing the stacked body and the first and second conductive films, and coupled to the second interconnect.

16. A method for manufacturing a semiconductor memory device, comprising:
forming a diode in an upper layer portion of a semiconductor substrate;
forming a first insulating film above the semiconductor substrate;
forming a first conductive film above the first insulating film, the first conductive film being coupled to the diode;
forming a stacked body above the first conductive film by alternately forming a first insulating material film and a second insulating material film;
forming a hole in the stacked body to reach the first conductive film by performing reactive ion etching;
forming a charge storage member inside the hole;
forming a semiconductor member inside the hole where the charge storage member is formed, the semiconductor member being connected to the first conductive film; and
replacing the second insulating material film with an electrode film after the forming of the semiconductor member.

17. The method according to claim 16, wherein
the forming of the first insulating film includes forming a plug inside the first insulating film, the plug being coupled between the diode and the first conductive film, and
the method further comprises subdividing the first conductive film into a first portion and a second portion after the forming of the hole, the first portion being connected to the semiconductor member, the second portion being connected to the plug.

18. The method according to claim 16, wherein
the forming of the diode includes
forming a first semiconductor layer of a first conductivity type in a portion of the upper layer portion of the semiconductor substrate,
forming a second semiconductor layer of a second conductivity type in a portion of an upper layer portion of the first semiconductor layer, and
forming a third semiconductor layer of the first conductivity type in a portion of an upper layer portion of the second semiconductor layer, the first conductive film being coupled to the third semiconductor layer.

19. A method for manufacturing a semiconductor memory device, comprising:
forming a diode in an upper layer portion of a semiconductor substrate;
forming a first insulating film above the semiconductor substrate;
forming a first conductive film above the first insulating film, the first conductive film being coupled to the diode;
forming an intermediate insulating film above the first conductive film;
forming a plug piercing the intermediate insulating film;
forming a second conductive film above the intermediate insulating film, the second conductive film being coupled to the first conductive film via the plug;
forming a stacked body above the second conductive film by alternately forming a first insulating material film and a second insulating material film;
forming a hole in the stacked body, the second conductive film, and the second insulating film to reach the first conductive film by performing reactive ion etching;
forming a charge storage member inside the hole;
forming a semiconductor member inside the hole where the charge storage member is formed, the semiconductor member being connected to the first conductive film;
subdividing the second conductive film into a first portion and a second portion after the forming of the hole, the first portion surrounding the semiconductor member, the second portion being connected to the plug; and
replacing the second insulating material film with an electrode film after the forming of the semiconductor member.

20. The method according to claim 19, wherein
the forming of the diode includes
forming a first semiconductor layer of a first conductivity type in a portion of the upper layer portion of the semiconductor substrate,
forming a second semiconductor layer of a second conductivity type in a portion of an upper layer portion of the first semiconductor layer, and
forming a third semiconductor layer of the first conductivity type in a portion of an upper layer portion of the second semiconductor layer, the first conductive film being coupled to the third semiconductor layer.

* * * * *